(12) United States Patent
Chen et al.

(10) Patent No.: US 7,615,841 B2
(45) Date of Patent: Nov. 10, 2009

(54) DESIGN STRUCTURE FOR COUPLING NOISE PREVENTION

(75) Inventors: Hsien-Wei Chen, Sinying (TW); Hsueh-Chung Chen, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 531 days.

(21) Appl. No.: 11/119,868

(22) Filed: May 2, 2005

(65) Prior Publication Data

US 2006/0244133 A1   Nov. 2, 2006

(51) Int. Cl.
*H01L 23/544* (2006.01)

(52) U.S. Cl. .................. 257/508; 438/348; 438/361; 257/E23.114

(58) Field of Classification Search .......... 257/508, 257/659, 660, E23.114; 438/348, 361
See application file for complete search history.

(56) References Cited

U.S. PATENT DOCUMENTS

| | | | |
|---|---|---|---|
| 6,243,441 B1* | 6/2001 | Zur | 378/98.8 |
| 6,373,120 B1* | 4/2002 | Oiyama | 257/529 |
| 6,537,849 B1* | 3/2003 | Tsai et al. | 438/106 |
| 6,608,379 B2* | 8/2003 | Yeo et al. | 257/706 |
| 6,753,608 B2 | 6/2004 | Tomita | |
| 6,815,821 B2 | 11/2004 | Yu | |
| 6,982,477 B2* | 1/2006 | Adan | 257/659 |
| 6,998,712 B2* | 2/2006 | Okada et al. | 257/758 |
| 7,193,296 B2* | 3/2007 | Fujita | 257/620 |
| 2003/0020098 A1* | 1/2003 | Sasaki | 257/210 |
| 2003/0155962 A1* | 8/2003 | Itoh et al. | 327/534 |
| 2003/0230147 A1* | 12/2003 | Stratton et al. | 73/727 |
| 2006/0087002 A1* | 4/2006 | Miwa et al. | 257/529 |

* cited by examiner

*Primary Examiner*—Thao X Le
*Assistant Examiner*—Ajay K Arora
(74) *Attorney, Agent, or Firm*—Slater & Matsil, L.L.P.

(57) ABSTRACT

A semiconductor structure for preventing coupling noise in integrated circuits and a method of forming the same are provided. The semiconductor structure includes a signal-grounded seal ring. The seal ring includes a plurality of metal lines, each in a respective metal layer and surrounding a circuit region of the semiconductor chip, a plurality of vias connecting respective metal lines, and a plurality of dielectric layers isolating each metal layer from any other metal layers. The seal ring may further include additional seal rings formed inside or outside the seal ring. The semiconductor structure may include laser fuses and protective rings. The protective rings are preferably signal grounded. Cross talk between sub circuits in a chip can be reduced by forming a seal ring extension between the sub circuits.

12 Claims, 9 Drawing Sheets

DESIGN STRUCTURE FOR COUPLING NOISE PREVENTION

TECHNICAL FIELD

This invention relates generally to the formation of integrated circuits, and more specifically to the prevention of cross talk between signal lines.

BACKGROUND

Interference, or cross talk, occurs between two closely spaced signal lines. The cross talk is caused by electromagnetic fields generated by the signal lines. Due to cross talk, noise is generated in the signal lines and affects the functioning of the circuit.

The problem will become worse in future generations. Due to the scaling down of device geometries in deep-sub-micron technologies, interconnect wires are placed in increasingly closer proximity and higher density. With increased use of stacked dies and system in package (SIP) technologies, cross talk between chips increases significantly due to the small distance between chips. As a result of the increasing circuit density, coupling noise has increased significantly, and has become an important concern in high performance circuit design. If not compensated for, coupling noise may cause signal delays, logic errors, and even circuit malfunctions.

Figure 1:
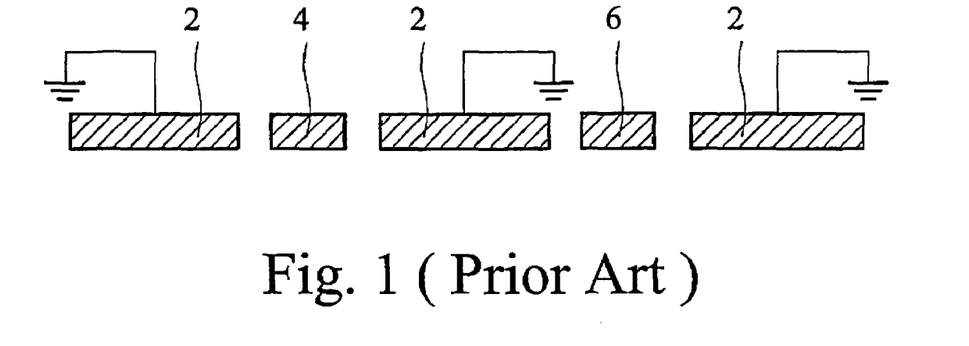
FIG. 1 illustrates a conventional coplanar structure for reducing cross talk, wherein the signal lines are isolated by signal-grounded metal lines.

Cross talk can be reduced using isolation structures, particularly grounded metal lines or metal planes. FIG. 1 illustrates a conventional coplanar structure for reducing cross talk. Signal lines 4, 6 and signal-grounded lines 2 are located on the same plane. The respective electromagnetic fields generated by the signal lines 4 and 6 are partially insulated by signal-grounded lines 2 and thus the cross talk is reduced.

Figure 2:
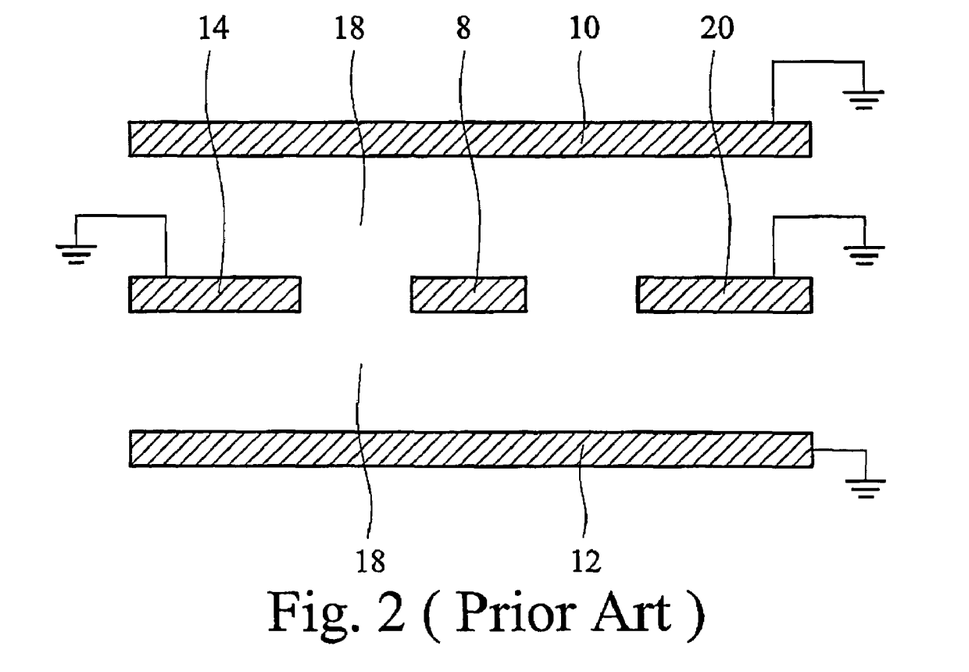
FIG. 2 illustrates a conventional cross talk prevention structure, wherein a signal line is enclosed in a signal-grounded metal structure.

Although the structure shown in FIG. 1 is simple from a design and manufacturability perspective, the cross talk isolation effect is not satisfactory. For better isolation effects, a cable-like structure may be adopted. FIG. 2 is a cross sectional view of the structure. Three metal layers are separated by dielectrics 18. A signal line 8 is formed in the middle layer between two signal-grounded lines 14 and 20. In addition, two signal-grounded metal planes 10 and 12 are in metal layers above and below the signal line 8, respectively. Signal-grounded metal lines 14, 20, and metal planes 10 and 12 form an enclosed structure similar to a cable. This structure has a good cross talk insulation effect.

Conventional solutions suffer some drawbacks. In integrated circuits, space consumption is one of the major concerns. The conventional solutions have significant space consumption; therefore, their usages are limited. Additionally, signal lines are typically wired from devices in the substrate to a topmost metal layer through multiple layers. Adding grounded structures thus increases the complexity of the circuit design (e.g., may require additional metal layers).

What is needed, therefore, is a structure that provides sufficient cross talk isolation without the negative consequences of prior art solutions.

SUMMARY OF THE INVENTION

The preferred embodiments of the present invention provide a semiconductor structure for preventing coupling noise between chips, between integrated circuits in a chip and a method of forming the same.

In accordance with one aspect of the present invention, the semiconductor structure includes a seal ring that comprises a plurality of metal lines, each in a respective metal layer located in a vicinity of an edge portion of a semiconductor chip so as to surround a circuit region of the semiconductor chip, a plurality of vias connecting the respective metal lines, and a plurality of dielectric layers isolating respective metal layers. The seal ring is signal grounded. By enclosing the signal lines of the chip in a signal-grounded seal ring, the cross talk between chips is reduced.

In accordance with another aspect of the present invention, the seal ring extends into the circuit region and thus divides the circuit into sub circuits. The sub circuits are effectively isolated by the seal ring and extensions. Coupling noise between sub circuits is significantly reduced.

In accordance with yet another aspect of the present invention, more than one seal ring is formed with the outside ones enclosing the inside ones. At least one, and preferably all, of the seal rings are signal grounded.

In accordance with yet another aspect of the present invention, the semiconductor structure includes laser fuses and protective rings. The protective rings are preferably signal-grounded for noise isolation.

In accordance with yet another aspect of the present invention, the seal ring is connected to an adjustable potential that is preferably connected to a shielded group.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an integrated circuit, metal lines may carry DC or AC current. Throughout the specification, metal lines carrying AC current are referred to as signal lines. Metal lines carrying signals with high current and high frequency have stronger cross talk with other lines. Cross talk is much more severe when the signal frequency is higher than about 1 GHz, and especially higher than about 3 GHz. The preferred embodiments of the present invention are preferably used for such high signal frequencies. The intermediate stages of manufacturing a preferred embodiment of the present invention are illustrated in FIGS. 4 through 9. The variations of the preferred embodiments are then discussed. Throughout the various views and illustrative embodiments of the present invention, like reference numbers are used to designate like elements.

The present invention explores a novel structure of isolating cross talk between chips, and/or between circuits in a chip. The structure involves the use of seal rings, which play an important role in the back-end of semiconductor processes. Seal rings provide a stress protection structure around an integrated circuit and can protect the internal circuit inside a chip from damage during a chip scribe line region treatment.

Figure 3:
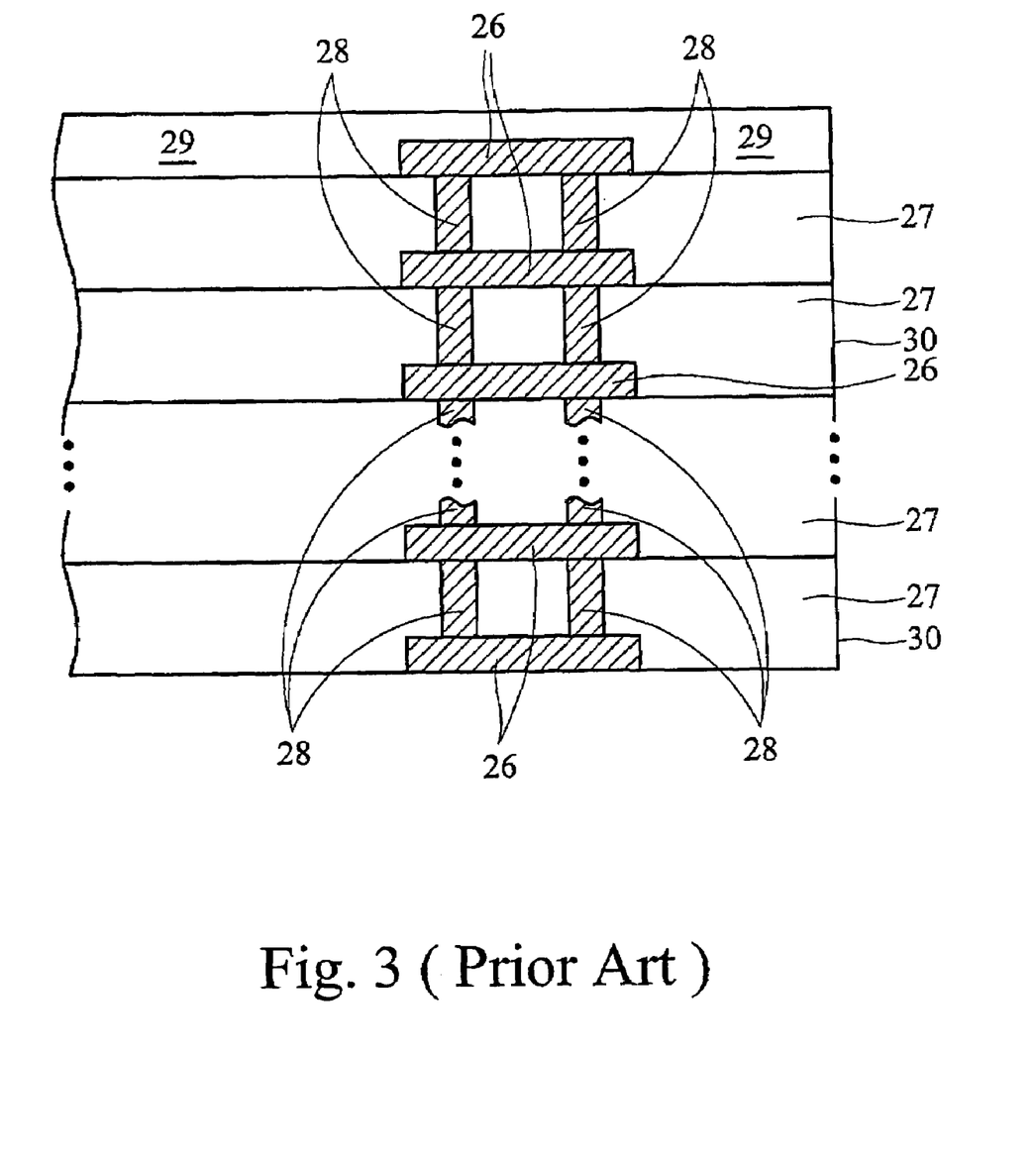
FIG. 3 illustrates a conventional seal ring.

A typical seal ring is formed of interconnected layers and vias surrounding circuit regions. FIG. 3 is a schematic view of a part of a seal ring 21. The seal ring 21 is typically formed on an inner side of a dicing line 30, sometimes also referred to as a scribe line. Typically, there is a circuit region (not shown) on the left-hand side of the drawing and a dicing region (a region to be cut during dicing) on the right-hand side of the drawing.

The seal ring 21 has a structure with interconnected metal components that includes metal lines 26, dielectric layers 27, and conductive vias 28. The metal lines 26 and vias 28 are electrically connected. Moreover, a passivation film 29 is formed on the uppermost interlayer insulating film.

Because of the provision of the seal ring 21 and the passivation film 29, the circuit region of the semiconductor device is protected from influences of external environments, thus it is possible to ensure stability of properties of the semiconductor device over a long period of time. Typically, seal rings are electrically floating and do not provide electrical protection.

Figure 4:
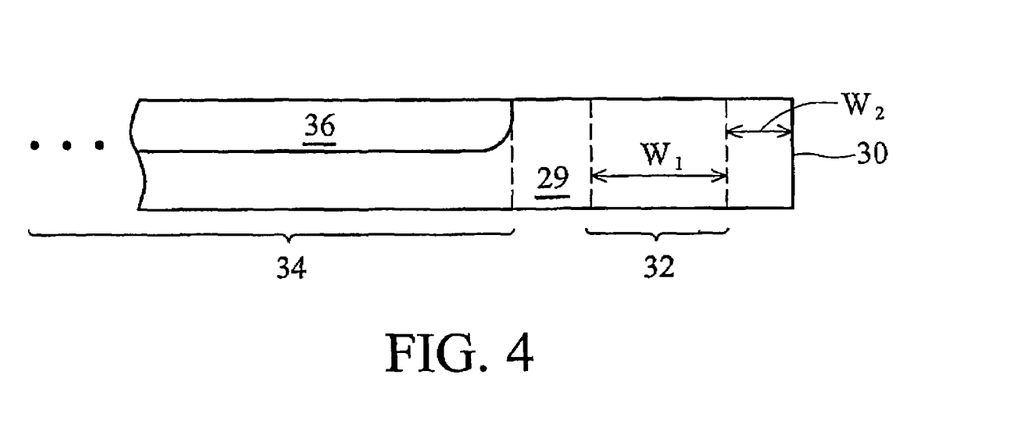
FIGS. 4 through 9 are cross-sectional views of intermediate stages in the manufacture of a preferred embodiment of the present invention, wherein single or dual damascene processes are preferably used for the formation of a seal ring.

Seal rings are typically formed along edges of the chips. FIG. 4 illustrates a schematic cross sectional view of a part of a chip. For simplicity, only one edge 30 of the chip is shown. Region 34 is the circuit region enclosed by a seal ring. It comprises a region 36, which is one of the active regions in substrate 29. Throughout the description, a region includes not only a portion in the substrate, but also the corresponding portion above the substrate and in the metal layers. The seal ring (not shown) occupies the metal layer space above the region 32, which typically has no devices formed therein. In some embodiments, however, active devices may be formed in the region 32. The region 32 preferably has a width of between about 5 nm to 30 nm.

Figure 5:
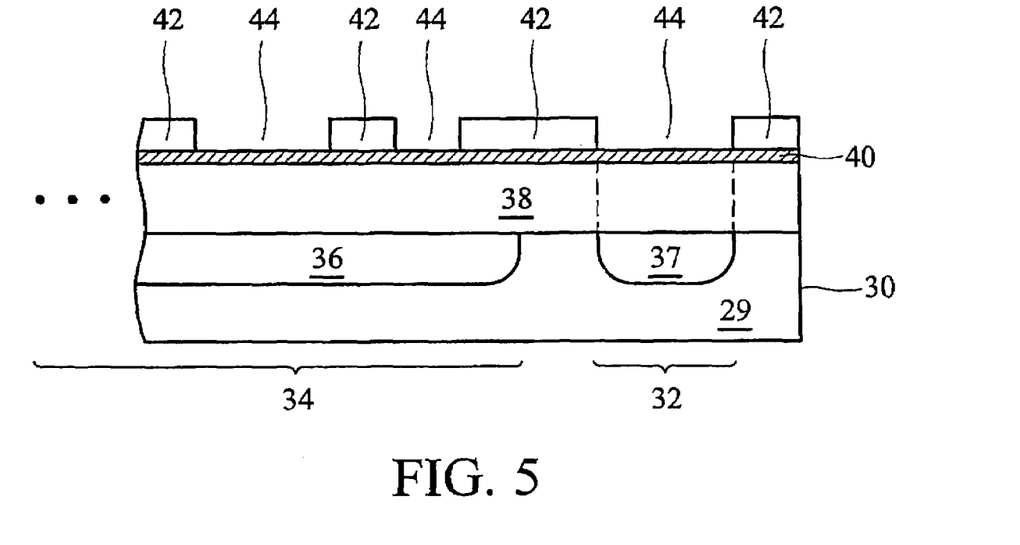
Figure 6:
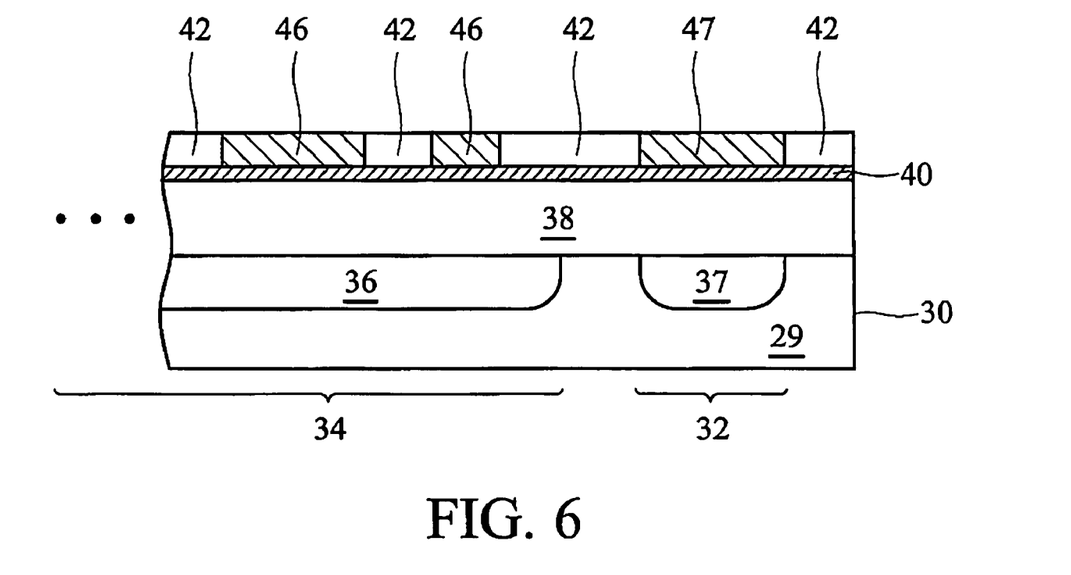

FIGS. 5 and 6 illustrate the formation of a first metal layer. Initially, devices are formed in an active region 36, and contact plugs (not shown) are formed to connect devices to upper layer metal lines. In region 32, a seal ring metal line is formed. Optionally, a conductive line 37 is formed in the substrate in region 32, and is connected to a subsequently formed seal ring.

In the preferred embodiment, metal lines 46 and 47 are formed of copper, copper alloys or any other conductive material and may be formed using single damascene or dual damascene processes. In order to show how the preferred embodiment of the present invention integrates the formation of typical device metal layers and seal ring metal layers, examples of metal lines and vias are shown in both regions 32 and 34. In FIGS. 5 and 6, metal lines 46 and 47 are formed using single damascene processes as described as follows. An inter-layer dielectric (ILD) 38 is formed. An etch stop layer (ESL) 40 is formed on the ILD 38. An inter-metal dielectric (IMD) 42 is formed on the ESL 40. Trenches 44 are formed in the IMD 42. A diffusion barrier layer (not shown) is typically formed in trenches 44. The barrier layer is preferably formed of a material comprising titanium, titanium nitride, tantalum, tantalum nitride, or other alternatives. Copper or copper alloy is then deposited into the trenches 44, followed by a chemical mechanical polish (CMP) to remove excessive material and form metal lines 46 and 47. Metal lines 46 are connected to devices in the active region 36, and metal line 47 forms a part of the seal ring. Since a chip typically has four edges 30 that form a square, seal ring metal line 47 forms a closed loop on the inner side of the edges 30 (Referring to feature 70 in FIG. 11). The width of the seal ring metal line is preferably between about 5 nm to about 20 nm.

Figure 7:
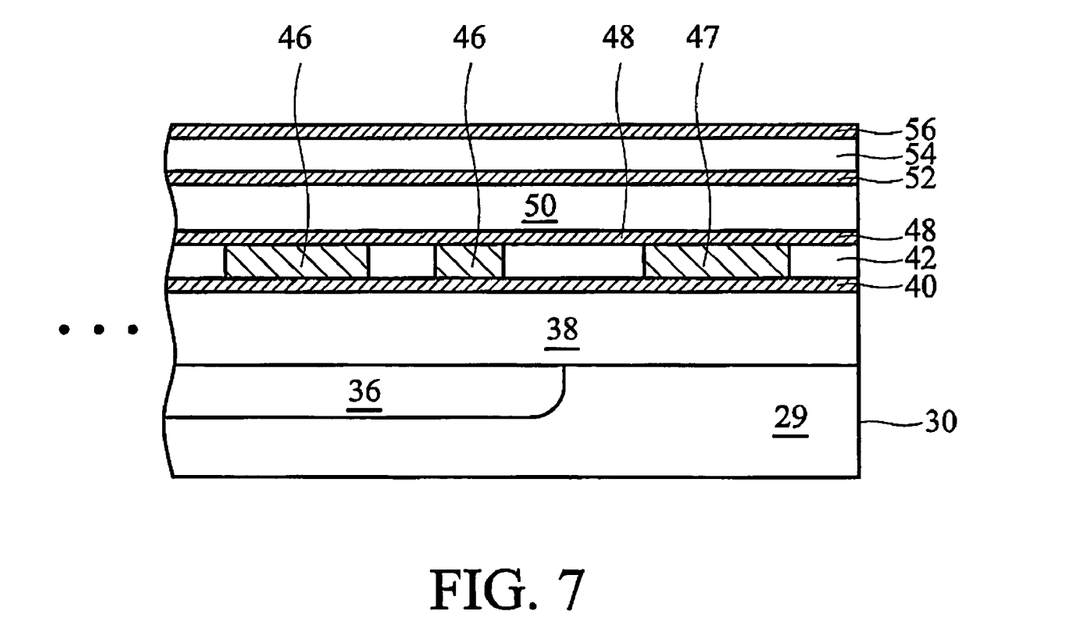

A dual damascene process is preferably performed to form vias and an upper-layer copper line. FIG. 7 shows a via etching stop layer (ESL) 48 formed on the metal lines 46 and 47. Via ESL 48 is preferably a dielectric comprising carbon, hydrogen, and oxygen, although other materials can also be used. A via IMD layer 50 is formed on the via ESL layer 48 providing separation between copper lines 46, 47 and an upper-layer copper line that will be formed subsequently. A trench etch stop layer (ESL) 52, a trench IMD 54 and a hard mask 56 are then formed. The trench ESL 52 is preferably formed by similar methods and using similar materials as ESL 40. The materials and methods of forming via IMD 50 and trench IMD 54 are well known in the art. Typically, dielectric layers 42, 50 and 54 can be formed of different materials having different characteristics, they can be used as etch stop layer themselves, and the ESL 40, 48, 52 and hard mask 52 are optional.

Figure 8:
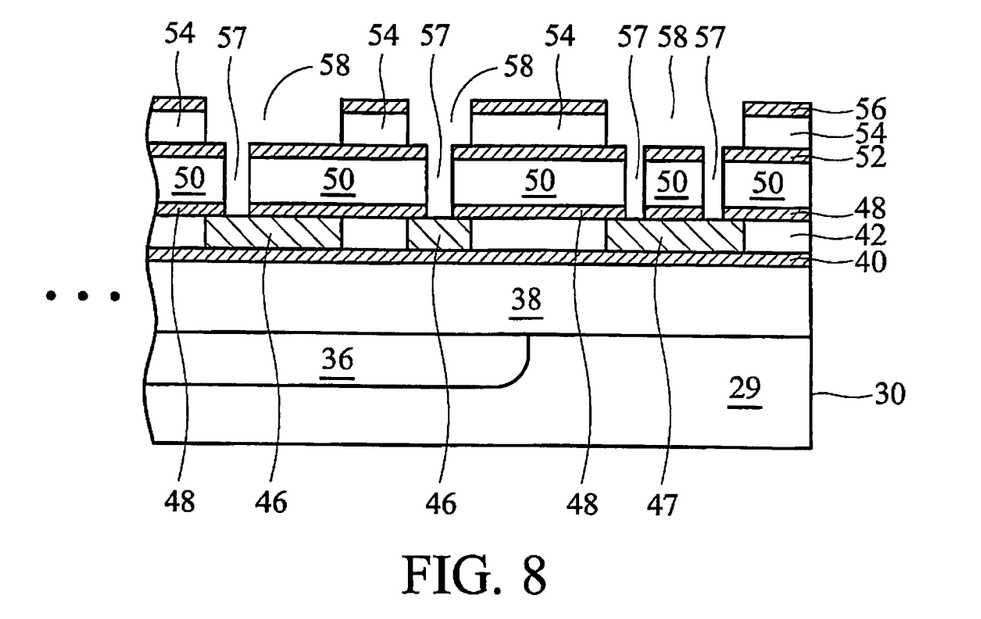

FIG. 8 illustrates the formation of via openings 57 and trench openings 58. A photo resist material (not shown) is formed and patterned over the surface hard mask 56. An anisotropic etch, preferably using fluorine containing etching gas, cuts through the surface hard mask 56 and etches down through the trench IMD 54, trench ESL 52, via IMD 50 and stops at the via ESL 48, therefore forming via openings 57. The via ESL 48 protects the underlying lower-layer metal line 47 from being etched. An anisotropic etch then cuts through the surface hard mask 56 and down through the trench IMD 54, stopping at the trench ESL 52 and thus forming the trench openings 58. The exposed portion of via ESL 48 is etched. Because via ESL 48 is quite thin relative to IMD layers 50 and 54, process control and end-point detection are much more closely controlled, thus limiting the likelihood of over-etching the underlying lower-layer copper line 47.

Figure 9:
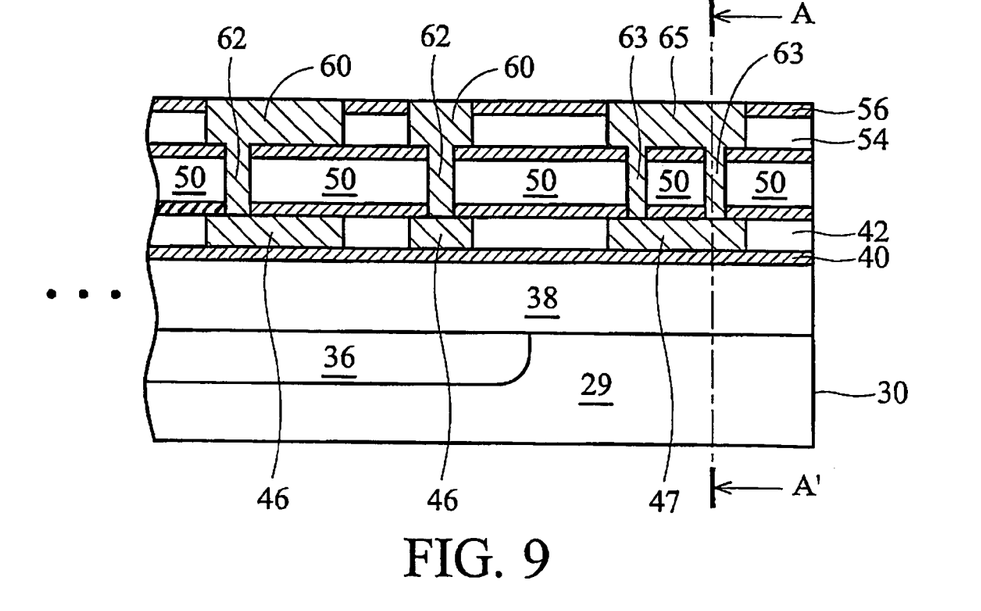

FIG. 9 illustrates the formation of metal lines 60 and 65, and vias 62 and 63. A barrier layer (not shown), preferably comprises titanium, titanium nitride, tantalum, tantalum nitride, and combinations thereof, is preferably formed in the openings 57 and 58. The barrier layer prevents copper from diffusing into IMD layers 50 and 54. The remaining space of the via openings 57 and trench openings 58 are filled with conductive materials, preferably copper or copper alloys. A CMP is performed to level the surface. A via layer and a metal line layer are thus formed for both the active region and seal ring region simultaneously.

In the preferred embodiment, the above-described forming process is repeated for forming upper metal layers in upper inter-metal dielectric layers until the metal lines in a topmost metal layer are formed. Typically, a passivation layer is formed and bumping pads (or bond pads) are formed through the passivation layer. In alternative embodiments, the previously discussed metal lines and vias comprise other metals such as titanium or aluminum, and can be formed by blanket depositing and patterning a metal layer, as is known in the art. In the resulting structure, signals are routed through the multiple levels of metal lines to/from devices in the substrate 29. Therefore, signal lines are distributed throughout multiple metal layers.

Figure 10:
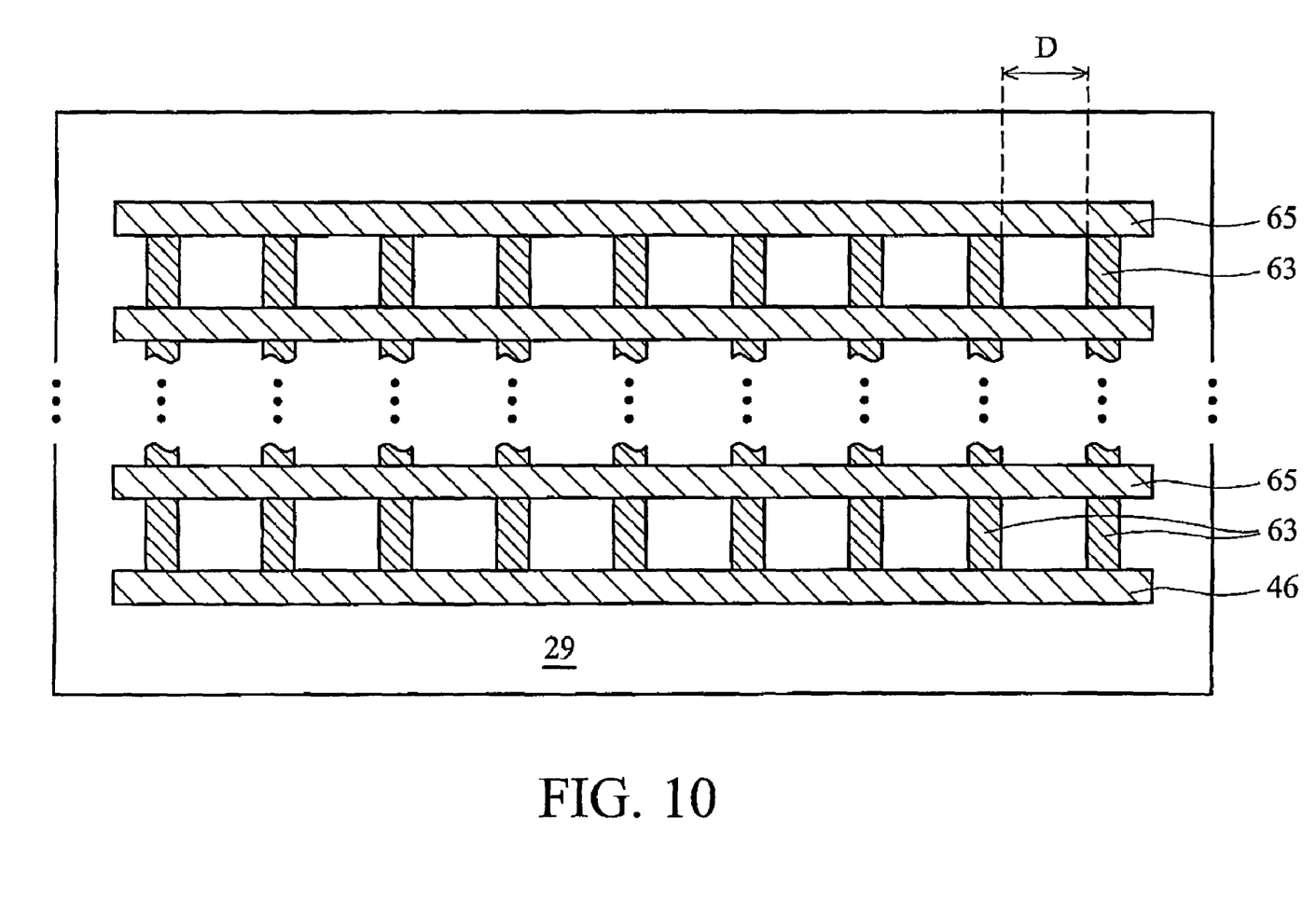
FIG. 10 is a cross sectional view of a seal ring along line A-A' in FIG. 9, wherein a series of vias is used to connect metal lines in neighboring metal layers.

In order to isolate cross talk effectively, multiple vias are preferably formed along the edges of the chips. The vias 63 shown in FIG. 9 are actually a series of vias. FIG. 10 illustrates a cross-sectional view along line A-A' in FIG. 9. Each respective metal layer is electrically coupled to the immediately subjacent or superjacent metal layer by a plurality of vias. In this way, every metal layer from the bottom-most to the top-most is electrically connected. It is noted that vias 63 and metal lines 46 and 65 form a mesh circling the signal lines. The distance D between the vias typically relates to the signal frequency, and the higher the signal frequency is, the smaller the preferred via distance. In the case where the signal frequency is higher than about 1 GHz, the preferred distance D is preferably less than about 1 nm.

Figure 11:
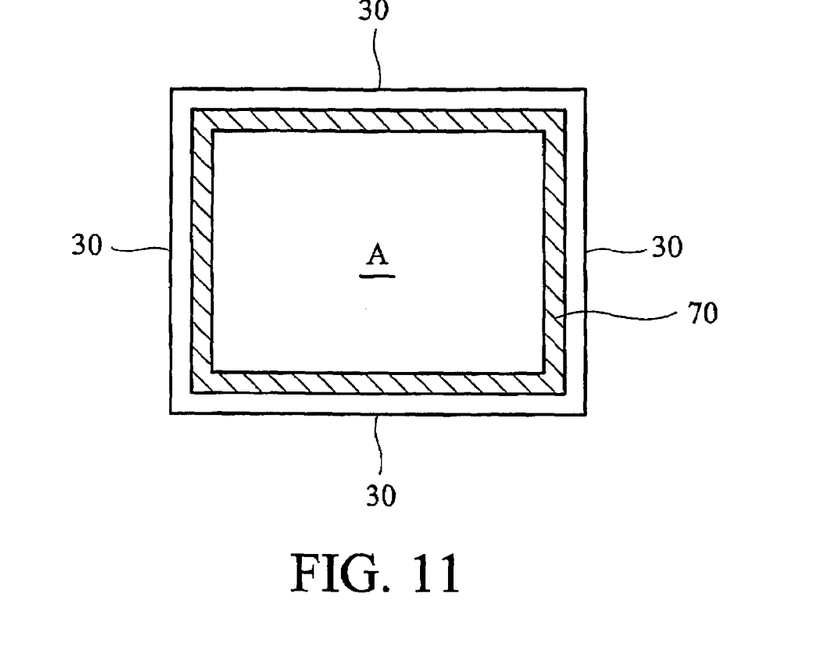
FIG. 11 is a top view of the preferred embodiment of the present invention.

FIG. 11 illustrates a top view of the structure shown in FIGS. 9 and 10. In the preferred embodiment, seal ring 70 is close to the edges 30 of the chip and surrounds the active circuit region A. All signal lines in the chip are substantially enclosed in the seal ring 70. When the metal seal ring is signal grounded, the signal lines are isolated from outside circuits. Therefore, the cross talk between signal lines in the chip and other chips is reduced. Throughout the description, when a conductive feature, such as a metal line, is referred to as signal grounded, it is either connected to the ground, or a (high frequency) shield group, wherein signals (particularly high frequency signals) in the shield group are filtered. In either case, when signal grounded, the conductive feature is substantially free of noise, particularly high frequency noise. A signal ground is therefore defined as the ground or the shielded group that is substantially noise free. In the preferred embodiment, the seal ring is signal grounded. In other embodiments, the seal ring is connected to an adjustable voltage potential through a separate pad connected to an outside source.

Figure 12:
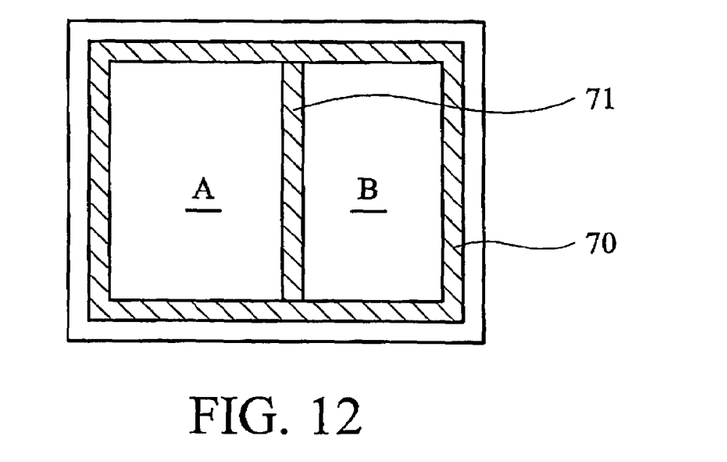
FIG. 12 illustrates a variation of the preferred embodiment of the present invention, wherein a seal ring extension is formed to divide the integrated circuit on a chip into sub circuits; the cross talk between sub circuits is reduced.

In other embodiments, seal ring 70 can be extended to isolate sub circuits in a chip. FIG. 12 illustrates a chip comprising a circuit A and a circuit B that need to be isolated. For example, circuits A and B are analog and digital circuits, respectively. The integration of the digital and analog circuits in one chip causes noise coupling between them. The analog circuit is especially affected by the noise generated in the digital circuit. Circuit A and circuit B may be isolated by a seal ring extension 71, which is also preferably formed from metal layer 1 to the topmost metal layer, such as metal layer nine. Multiple seal ring extensions can be formed to further dividing sub circuits A and B into more sub circuits. In the preferred embodiment, the seal ring extension 71 is signal-grounded, and preferably connected to seal ring 70 to achieve better effects. In other embodiments, the seal ring extension 71 is signal-grounded, but not connected to the seal ring 70.

Figure 13:
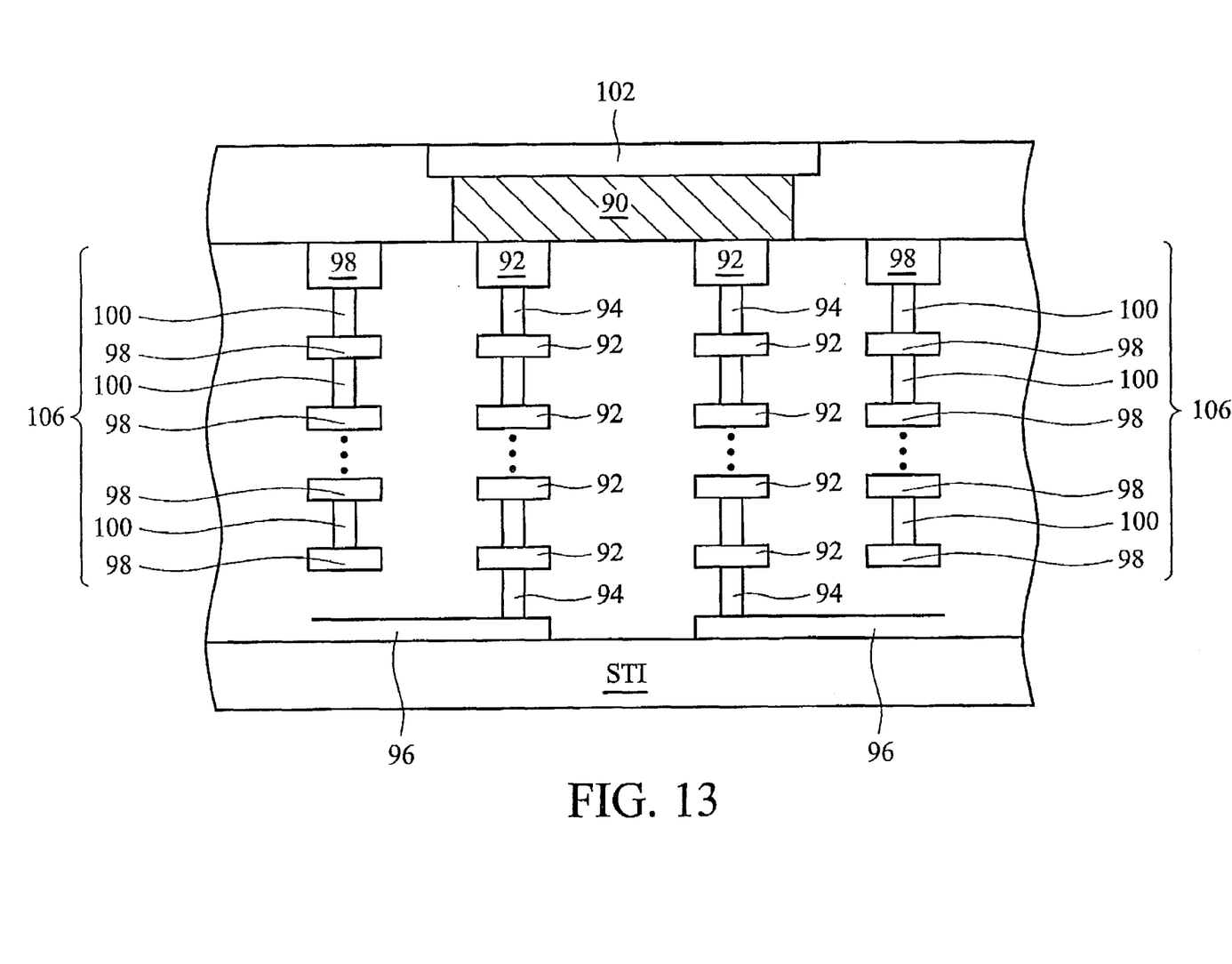
FIG. 13 illustrates a laser fuse and a protective ring, wherein the protective ring is signal grounded.

An integrated circuit may include laser fuses, which are used for activating redundant circuits. FIG. 13 illustrates a laser fuse structure and a protective ring. A laser fuse 90 is close to the top surface of the chip. Through layers of metal islands 92 and vias 94, the laser fuse 90 is connected to two conductive lines 96, which are connected to integrated circuits. By etching and opening a fuse window 102, the laser fuse 90 is exposed and can be broken by laser, thus an open circuit is formed between the conductive lines 96. A redundant circuit will then replace a malfunctioned circuit.

Due to high stress introduced during the laser process, a protection ring 106, which substantially surrounds the laser fuse 90 structure, is typically formed to protect the laser fuse structure from mechanical stress. The protection ring 106 has a similar structure as seal rings, and is formed of interconnected metal islands 98 and vias 100. It is preferred that the protective ring is signal grounded for coupling noise isolation. In the preferred embodiment, the protective ring may be connected to the seal ring or seal ring extensions. In other embodiments, the protective ring is isolated without being connected to the seal ring or seal ring extensions.

Figure 14:
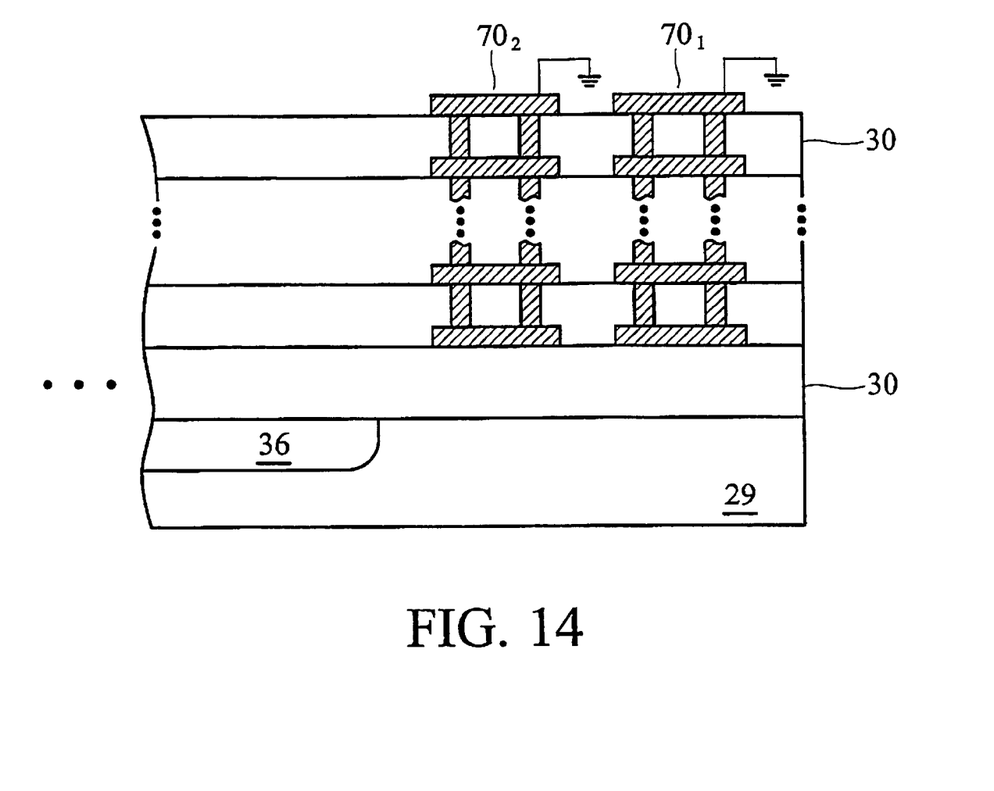
FIG. 14 illustrates another variation of the preferred embodiment of the present invention, wherein more than one seal ring is formed on a chip.

For structure reasons, it is common that two or three seal rings are formed with the outside seal rings enclosing inside seal rings. FIG. 14 illustrates a cross sectional view of a chip comprising two seal rings $70_1$ and $70_2$. At least one of the seal rings is signal grounded. Preferably, all seal rings are signal grounded to provide better isolation.

Figure 15:
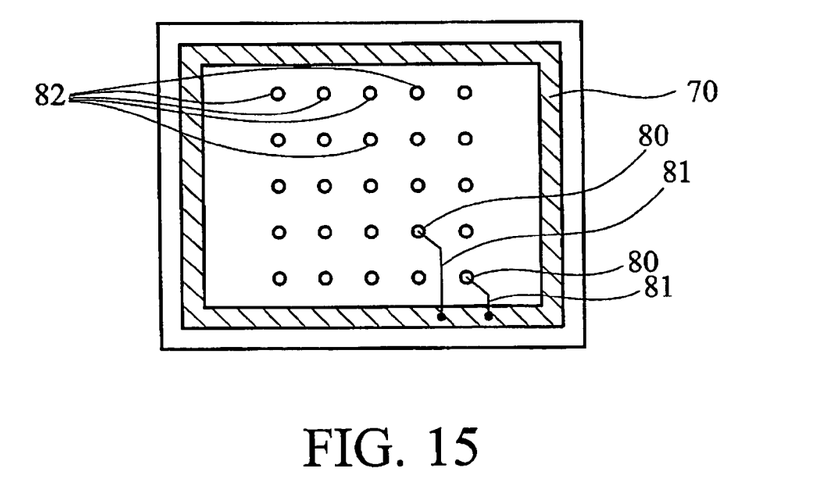
FIG. 15 is a top view of the preferred embodiment of the present invention with a flip chip design.

Seal rings, as well as seal ring extensions and protective rings, may be signal grounded through external pads or through existing ground lines in the chip. FIG. 15 illustrates a top view of a bump pad redistribution scheme having a flip chip design. Round dots 80 and 82 represent bump pads. The seal ring 70 is connected to bump pads 80 through metal wires 81, preferably built in the chip. The bump pads 80 will be connected to an external pin of the package and signal-grounded. In a wire bond design, the seal ring is wire bonded directly to an external pin of the package through external pads.

The preferred embodiments of the present invention utilize existing seal rings for cross talk prevention. By enclosing signal lines in a cylinder-like signal-grounded seal ring, the cross talk between signal lines inside the seal ring and signal lines outside are effectively reduced. By providing a current return path, the inductance of the signal lines is reduced. The preferred embodiments of the present invention are fully compatible with standard integrated circuit manufacturing and packaging processes and no extra cost is involved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure formed in a semiconductor chip comprising:
    a seal ring electrically coupled to a signal ground and forming a closed loop, wherein the seal ring comprises substantially four edges, each adjacent a respective edge of the semiconductor chip, and wherein the seal ring comprises:
- a plurality of metal lines, each in a respective metal layer and surrounding a circuit region of the semiconductor chip;
- a plurality of vias connecting each metal line with a superjacent or subjacent metal line; and
- a plurality of dielectric layers respectively isolating each metal layer from each subjacent or superjacent metal layer; and
- a seal ring extension physically contacting the seal ring and dividing circuit regions, wherein the seal ring extension is inside a region encircled by edges of the semiconductor chip.

2. The integrated circuit structure of claim 1 wherein at least a portion of the circuit region is configured to be operated at a signal frequency of higher than about 1 GHz.

3. The integrated circuit structure of claim 2 wherein the signal frequency is higher than about 3 GHz.

4. The integrated circuit structure of claim 1 wherein the seal ring extension and a first portion of the seal ring encircle a first region of the semiconductor chip, and the seal ring extension and a second portion of the seal ring encircle a second region of the semiconductor chip.

5. The integrated circuit structure of claim 1 further comprising a bump pad connected to the metal lines wherein the bump pad is electrically coupled to the signal ground.

6. The integrated circuit structure of claim 1 further comprising a laser fuse and a protective ring substantially surrounding the laser fuse, wherein the protective ring is connected to the signal ground through an external pad.

7. The integrated circuit structure of claim 1, wherein the seal ring extension comprises:
- a plurality of additional metal lines, wherein each of the additional metal lines comprises two ends, and wherein each of the two ends is physically connected to one of the metal lines; and
- a plurality of additional vias connecting the respective additional metal lines to subjacent or superjacent additional metal lines.

8. The integrated circuit structure of claim 1 further comprising:
- a digital circuit in the semiconductor chip and inside the seal ring; and
- an analog circuit in the semiconductor chip and inside the seal ring, wherein the seal ring extension separates the digital circuit from the analog circuit.

9. An integrated circuit structure comprising:
- a seal ring comprising:
  - a plurality of metal lines, each in a respective metal layer;
  - a plurality of vias connecting the metal lines; and
  - a plurality of dielectric layers respectively isolating each metal layer from each subjacent or superjacent metal layer,
- wherein the seal ring comprises four edges, each adjacent a respective edge of the semiconductor chip, and wherein the seal ring is coupled to an adjustable voltage potential source; and
- a seal ring extension comprising a first end connected to a first one of the four edges of the seal ring and a second end connected to a second one of the four edges of the seal ring.

10. The integrated circuit structure of claim 9 wherein the first one and the second one are different ones of the four edges.

11. The integrated circuit structure of claim 10 wherein the seal ring extension is signal grounded.

12. The integrated circuit structure of claim 9 wherein the adjustable voltage potential belongs to a shielded group substantially free of noise.

* * * * *